(12) United States Patent
Lal et al.

(10) Patent No.: US 8,860,553 B2
(45) Date of Patent: Oct. 14, 2014

(54) SELF-POWERED, PIEZO-SURFACE ACOUSTIC WAVE APPARATUS AND METHOD

(75) Inventors: Amit Lal, Ithaca, NY (US); Steven Tin, Ithaca, NY (US)

(73) Assignee: Cornell University, Ithaca, NY (US)

( * ) Notice: Subject to any disclaimer, the term of this patent is extended or adjusted under 35 U.S.C. 154(b) by 589 days.

(21) Appl. No.: 13/128,684

(22) PCT Filed: Nov. 10, 2009

(86) PCT No.: PCT/US2009/063855
§ 371 (c)(1),
(2), (4) Date: May 11, 2011

(87) PCT Pub. No.: WO2010/054368
PCT Pub. Date: May 14, 2010

(65) Prior Publication Data
US 2011/0241839 A1  Oct. 6, 2011

Related U.S. Application Data

(60) Provisional application No. 61/193,251, filed on Nov. 10, 2008.

(51) Int. Cl.
*H04Q 5/22* (2006.01)
*G08C 19/00* (2006.01)
(Continued)

(52) U.S. Cl.
CPC ............... *G21H 1/02* (2013.01); *H03H 9/145* (2013.01); *H03H 9/0542* (2013.01); *H03B 5/326* (2013.01)
USPC .............. 340/10.1; 340/870.3; 340/545.4; 310/311; 310/320; 310/327; 310/318; 310/316.01; 310/323.06; 73/514.28; 73/514.34

(58) Field of Classification Search
USPC ................ 340/10.1, 933, 10.4, 572.8, 693.1; 310/305, 328, 330, 316.01, 319, 325, 310/348, 339; 235/492; 73/865, 504.01, 73/514.28, 514.16, 862.59, 649
See application file for complete search history.

(56) References Cited

U.S. PATENT DOCUMENTS 4,010,679 A * 3/1977 Dybel ........................ 100/346
4,626,729 A * 12/1986 Lewiner et al. ............. 310/324

(Continued)

FOREIGN PATENT DOCUMENTS

| JP | 2006254281 A | 9/2006 |
| WO | 9712430 A1 | 4/1997 |
| WO | 2004004119 A1 | 1/2004 |

*Primary Examiner* — Jennifer Mehmood
*Assistant Examiner* — Mirza Alam
(74) *Attorney, Agent, or Firm* — William Greener; Bond, Schoeneck & King, PLLC

(57) ABSTRACT

An autonomous, self-powered device includes a radioisotope-powered current impulse generator including a spring assembly comprising a cantilever, and a piezoelectric-surface acoustic wave (P-SAW) structure connected in parallel to the current impulse generator. Positive charges are accumulated on an electrically isolated $^{63}$Ni thin film due to the continuous emission of β-particles (electrons), which are collected on the cantilever. The accumulated charge eventually pulls the cantilever into the radioisotope thin-film until electrical discharge occurs. The electrical discharge generates a transient magnetic and electrical field that can excite the RF modes of a cavity in which the electrical discharge occurs. A piezoelectric-SAW resonator is connected to the discharge assembly to control the RF frequency output. A method for generating a tuned RF signal includes inputting an energy pulse to a P-SAW resonator, exciting the resonant frequency thereof, and outputting an RF signal having a frequency tuned to the resonator frequency.

24 Claims, 16 Drawing Sheets

(51) Int. Cl.
  *G08B 13/08*   (2006.01)
  *H01L 41/00*   (2013.01)
  *H02N 2/00*    (2006.01)
  *G01P 15/08*   (2006.01)
  *G01P 15/09*   (2006.01)
  *G21H 1/02*    (2006.01)
  *H03B 5/32*    (2006.01)
  *H03H 9/145*   (2006.01)
  *H03H 9/05*    (2006.01)

(56) References Cited

U.S. PATENT DOCUMENTS

| | | |
|---|---|---|
| 4,676,104 A | 6/1987 | Cullen |
| 4,746,830 A | 5/1988 | Holland |
| 5,291,165 A | 3/1994 | Whipple et al. |
| 5,465,468 A * | 11/1995 | Manna ................ 29/25.35 |
| 5,469,170 A | 11/1995 | Mariani |
| 5,825,839 A | 10/1998 | Baskis |
| 6,246,148 B1 | 6/2001 | Flowers et al. |
| 6,388,545 B1 | 5/2002 | Kawachi |
| 6,479,920 B1 | 11/2002 | Lal et al. |
| 6,535,545 B1 | 3/2003 | Ben-Bassat et al. |
| 6,630,900 B2 | 10/2003 | Stierlin et al. |
| 6,713,940 B2 | 3/2004 | Takamine |
| 6,827,281 B2 | 12/2004 | Edmonson et al. |
| 7,245,062 B2 | 7/2007 | Schmidt |
| 7,301,254 B1 | 11/2007 | Lal et al. |
| 7,380,454 B2 | 6/2008 | Dwyer et al. |
| 7,586,238 B2 | 9/2009 | Liu |
| 7,602,313 B2 | 10/2009 | Breed et al. |
| 2002/0014119 A1 * | 2/2002 | Williams ................... 73/514.28 |
| 2002/0175597 A1 * | 11/2002 | Raman et al. ................ 310/328 |
| 2004/0007942 A1 * | 1/2004 | Nishida et al. ............... 310/314 |
| 2004/0118929 A1 * | 6/2004 | Edmonson et al. ........... 235/492 |
| 2006/0000285 A1 * | 1/2006 | Edmonson et al. ............ 73/649 |
| 2007/0137300 A1 * | 6/2007 | Dwyer et al. ............. 73/504.01 |
| 2007/0145861 A1 * | 6/2007 | Tanner ........................ 310/339 |
| 2007/0273244 A1 | 11/2007 | Lal et al. |
| 2008/0036307 A1 * | 2/2008 | Lu et al. ......................... 310/15 |
| 2008/0042518 A1 * | 2/2008 | Liu ................................ 310/319 |
| 2008/0100176 A1 | 5/2008 | Haskell et al. |

\* cited by examiner

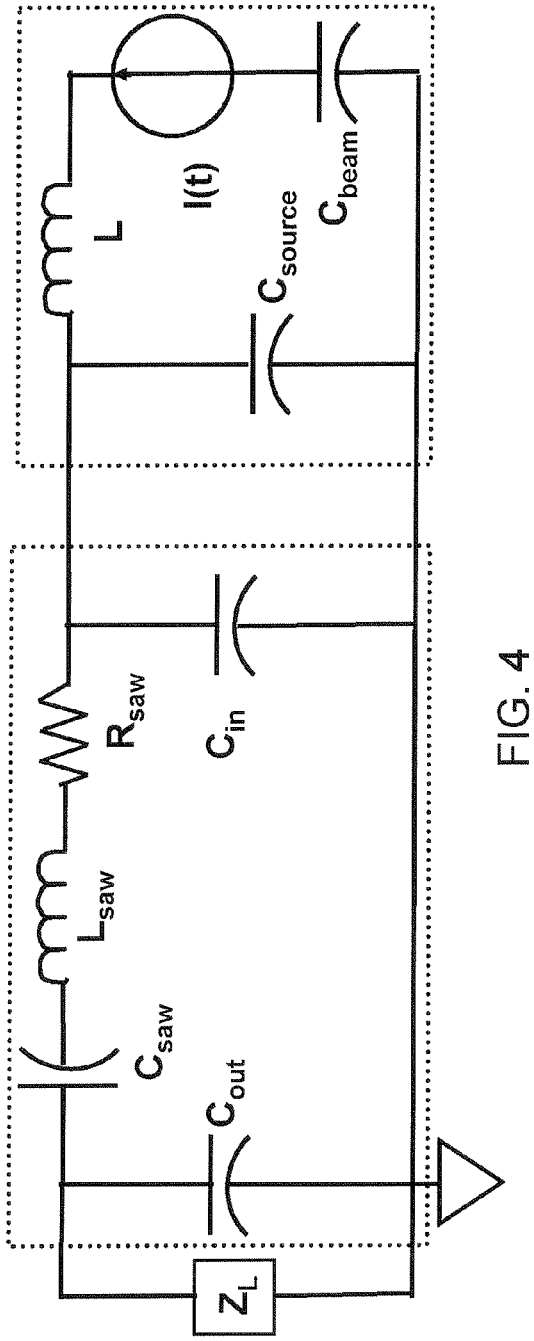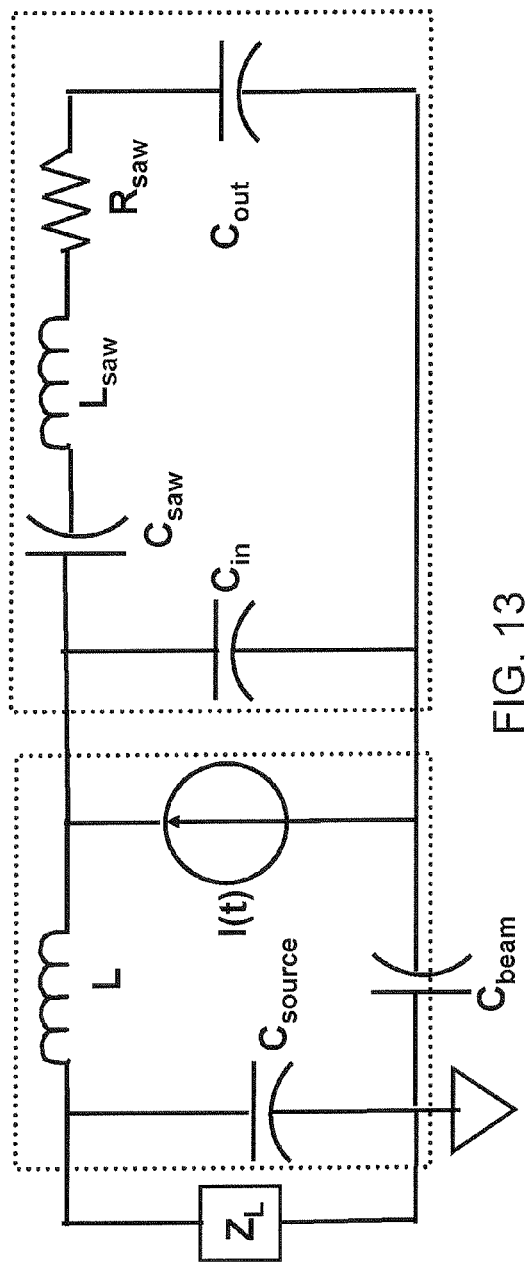
FIG. 4
FIG. 13

SELF-POWERED, PIEZO-SURFACE ACOUSTIC WAVE APPARATUS AND METHOD

FEDERALLY SPONSORED RESEARCH

This invention was made with government support under DARPA, grant number HR0011-07-1-0043. The government has certain rights in the invention.

RELATED APPLICATION DATA

The instant application claims priority to U.S. Provisional application Ser. No. 61/193,251 filed on Nov. 10, 2008, the subject matter of which is incorporated herein by reference in its entirety.

BACKGROUND OF THE INVENTION

1. Field of the Invention

Embodiments of the present invention relate to transponder, telemetry/receiver, and sensor apparatus and associated methods. More particularly, embodiments of the invention are directed to self-powered such apparatus having design-in frequency control and associated methods. Most particularly, embodiments of the invention are directed to a radioisotope-powered, piezoelectric-surface acoustic wave transducer and associated methods.

2. Description of the Related Art

Microelectromechanical systems (MEMS) have become pervasive through various applications in everyday life. The small size of MEMS and their fabrication materials naturally offer the opportunity for the integration of these structures with integrated circuits to provide autonomous Microsystems that do not require external power sources. The availability of a small size, reliable, temperature insensitive, and long operating internal power source having a long shelf life can significantly impact the utility of these autonomous microsystems. Even the smallest conventional batteries may be much larger than the MEMS for which they are supplying power, thus limiting the size reduction of devices for certain applications. In addition, conventional batteries have relatively short useful lifetimes, often on the order of days to, at most, several months, and may not operate well or at all at high or low temperatures. There exist applications where it is desirable to have a power source capable of supplying power to a MEMS for many months, years, and even decades. For example, MEMS-based sensors may be utilized to monitor various structural and environmental conditions and transmit this information to a reception location via optical or radio frequency (RF) communications. If such devices could be provided with power sources capable of supplying power for years or decades without replacement, sensor-based devices, for example, could be permanently embedded in buildings, bridges, etc., utilized in outer-space research, and other such applications envisioned by those skilled in the art.

One or more solutions to the need for a longer life power source are disclosed in U.S. Pat. Nos. 6,479,920 and 7,301,254, the subject matter of which are incorporated by reference herein in their entireties to the fullest extent allowed by applicable laws and rules. The aforementioned '920 patent discloses a device wherein the energy carried by particles emitted by radioactive decay in a radioisotope such as Nickel-63 is captured and converted to mechanical potential energy that is stored in an elastically deformable element. Electrical energy is also stored in the capacitor formed between the radioisotope connected electrodes. The release of the mechanical and electrical energy stored in the deformable element can be utilized to activate other mechanical parts directly or can be converted to electrical energy that can be supplied to drive electronic components such as an integrated circuit. Illustratively, the device includes a substrate such as single crystal silicon, glass, etc., with an elongated cantilever beam affixed thereto at one end, and having a free end. A radioactive source is mounted to the substrate under the free end of the beam and an absorber of radioactively emitted particles is mounted to the free end of the beam. A piezoelectric element having output terminals is secured to the top surface of the cantilever so that the piezoelectric plate will flex and deform with the deformable cantilever. The radioisotope source preferably emits electrons. The emitted electrons are absorbed and retained by the absorber, charging the absorber negatively, whereas the source retains a positive charge. As charge builds up on the absorber and the source, the electrostatic force between these elements increases, bending the cantilever beam so that the absorber begins to approach the source. After a specific length of time, the beam will bend sufficiently such that the absorber makes electrical contact with the source, thereby discharging the charge on these elements and releasing the beam, which resiliently returns toward its rest or normal position as it releases the potential energy stored in the bent beam. In doing so, the stress imposed on the piezoelectric plate is released, which generates a pulse of electrical power at the output terminals of the piezoelectric element. The electrical power generated by the piezoelectric element may be connected from its output terminals to a load, such as a radio frequency coil. The capacitance of the piezoelectric transducer element connected to the coil provides a resonant tank circuit that produces an electrical oscillation at a characteristic frequency, which is excited by the pulse of output voltage from the piezoelectric transducer. This voltage may be rectified and stored on a storage capacitor for use by other electronic components, and the high frequency oscillation may also be utilized to provide a radio (RF) signal that can be detected by a remote detector. In addition to the mechanical to electrical conversion, the stored charge in the capacitor is suddenly released creating a current impulse that in turn excites all of the fundamental cavity modes of the container incorporating the cantilever structure. The RF modes excited in the cavity and across the piezoelectric element electrical circuit can be coupled. The RF energy can be radiated away from the device to be picked up by a distant receiver.

A shortcoming of this device is that the frequency of the output RF signal is determined by the equivalent capacitance and inductance of the system. The resonant cavity and the equivalent circuit quality factor is generally low such that the energy in the pulse is distributed over a range of frequencies preventing precise frequency measurement over any appreciable distance in the presence of phase noise in receiving electronics. Furthermore, the cavity and circuit resonance frequency is a function of the dimensions and dielectric properties of the components, which can vary from one device to another, as non-lithographic methods are generally used to fabricate the devices. A tighter tolerance over the transmitted frequency is highly desired for specifying a given frequency to one transmitter, and also being able to make a narrowband pulse measurement that can generally be done with higher signal to noise ratio as the noise is lower in a narrow band of detection.

In view of the shortcomings and challenges associated with the prior art, the inventors have recognized a need for, and benefits of, a self-powered device as described herein above in which the RF frequency can be precisely controlled. The inventors further recognized the advantageous applications of such a device including, for example, as an autonomous transponder, a data telemetry and transmission device such as an RF identification tag (RFID, an autonomous sensor, and others recognized by those skilled in the art.

These and other advantages and benefits are achieved by the embodied invention, which will be described in detail below and with reference to the drawings.

SUMMARY OF THE INVENTION

An embodiment of the invention is a self-powered device that includes a radioisotope-powered current impulse (i.e., electrical discharge) generator and an interconnected piezoelectric-surface acoustic wave (P-SAW) apparatus. The current impulse generator further includes a spring assembly comprising a cantilever having at least one fixed end attached to a base and a reciprocable region, and a radioactive particle emitter. The P-SAW apparatus has an input port electrically connected in parallel to the current impulse generator and an output port. The cantilever of the spring assembly may take various forms. For example, in a non-limiting aspect, the cantilever is a simple cantilever beam having a fixed, proximal end and a freely reciprocable, distal end. In a non-limiting aspect, the cantilever is a clamped-clamped cantilever having two fixed ends and an intermediate reciprocable region. In a non-limiting aspect, the cantilever is a serpentine spring having a fixed, proximal end and a freely reciprocable, distal end that may include a radioactive particle collector. The radioisotope-powered current impulse generator includes a radioactive particle emitter that is attached to either the reciprocable region of the cantilever or the spring assembly at an opposing distance above or below the reciprocable region of the cantilever. If the radioactive source is not attached to the spring assembly per se, the cantilever, regardless of its form factor, should have a sufficient area to collect the electrons emitted by the radioactive source. If it does not, a radioactive particle collector may be attached to the reciprocable region of the cantilever. In a non-limiting aspect, the spring assembly is structurally integrated with the P-SAW apparatus in a vacuum environment. In a non-limiting aspect, an RF antenna can be coupled to the P-SAW output port. In a non-limiting aspect, the P-SAW structure can include a sensor or RFID tag, for example, between the input port and one or more output ports. According to a non-limiting aspect, the device may include multiple current impulse generators and P-SAW structures. In a non-limiting aspect, multiple discharging cantilevers could be connected to different resonant (carrier) frequency P-SAW structures. A single trigger from one cantilever could excite multiple RF pulses simultaneously that can be received at a single receiver, allowing multisensory information to be transmitted.

An embodiment of the invention is directed to a method for generating an RF signal having a tuned signal frequency. The method involves the steps of generating energy through an energy pulse from an autonomous electrical discharge system having a charging cycle and a discharge cycle; inputting the energy to an input port of a piezoelectric-SAW (P-SAW) structure characterized by a resonator frequency, wherein, during the charging cycle, storing an electrical component of the energy and a mechanical component of the energy in the P-SAW structure; during the discharge cycle, exciting the resonant frequency of the P-SAW structure; and, outputting an RF signal having a frequency tuned to the P-SAW resonator frequency from an output port of the P-SAW structure.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

The present invention will be more fully understood and appreciated by reading the following Detailed Description in conjunction with the accompanying drawings, in which:

FIG. 4 is a schematic circuit diagram of the apparatus configuration illustrated in FIG. 1;

FIG. 13 is a schematic circuit diagram of the apparatus configuration illustrated in FIG. 12;

FIG. 18(*b*) schematically illustrates the connections of a multi-apparatus device similar to that shown in FIG. 18(*a*);

DETAILED DESCRIPTION OF THE EMBODIMENTS OF THE INVENTION

Reference will now be made in detail to the present exemplary embodiments of the invention, examples of which are illustrated in the accompanying drawings. Wherever possible, the same reference numbers will be used throughout the drawings to refer to the same or like parts.

Figure 1:
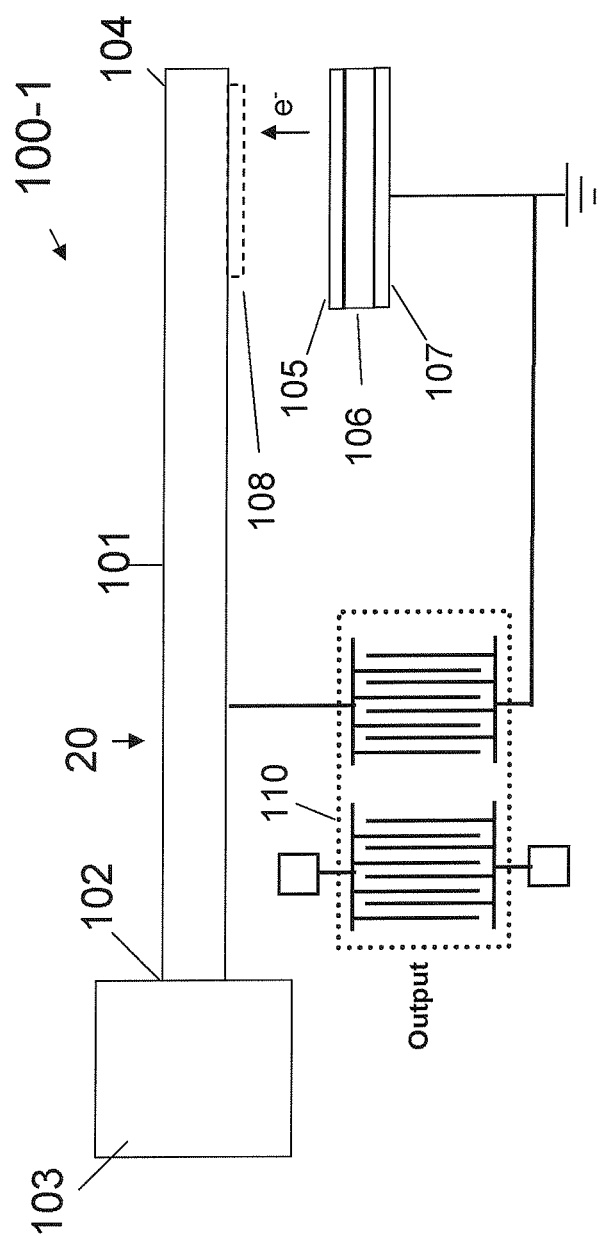
FIG. 1 is a schematic side-view diagram of an apparatus according to a non-limiting, illustrative aspect of the invention.

FIG. 1 schematically shows in cross section a radioisotope-powered, piezoelectric-surface acoustic wave (P-SAW) device 100-1 according to an exemplary embodiment of the invention. The device 100-1 includes a spring assembly 20 comprised of a simple cantilever beam 101 secured at a proximal end 102 thereof to a base 103. A distal end 104 of the beam is free to reciprocate up and down. The apparatus further comprises a radioisotope source 105, a dielectric insulator 106, a bottom electrode 107 and, optionally, a radioactive particle (e.g., electron) collector 108 attached to the distal end of the beam in opposition to the radioactive particle source. Note that the beam itself may have sufficient surface area to collect the electrons without the need for a separate collector attached thereto, as described in greater detail below. The relative locations of the radioisotope source and the (optional) radioactive particle collector could be reversed. A P-SAW structure 110 is electrically connected to, and forms part of, the device.

Figure 2:
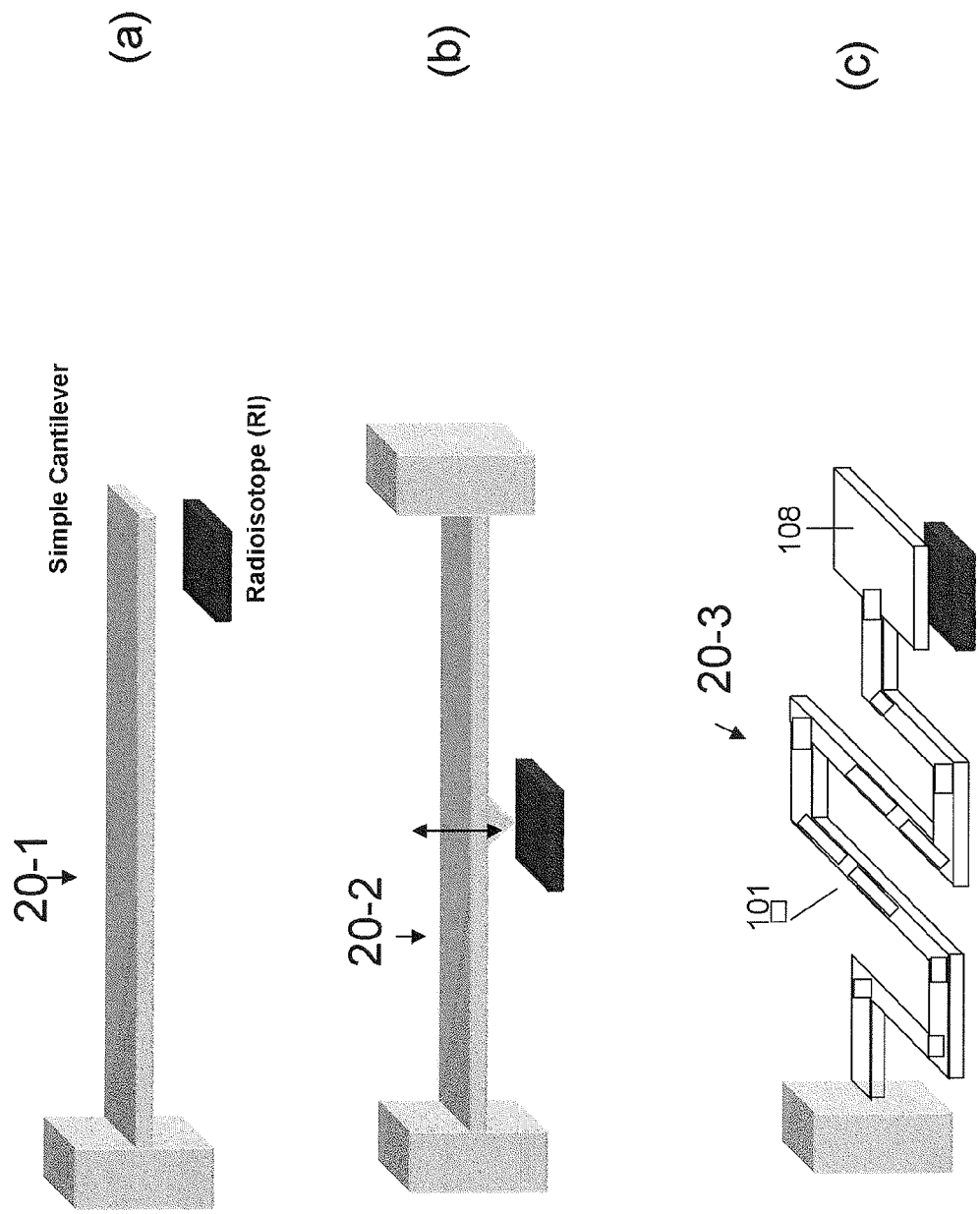
FIGS. 2(a-c) show cantilever form factors of a spring assembly of an embodied device according to non-limiting, illustrative aspects of the invention.

Although the description that follows of an exemplary embodiment discusses the spring assembly as including a simple cantilever beam 20-1 as shown illustratively in FIG. 2*a*, other cantilever form factors may be employed. For example, FIG. 2*b* illustrates a clamped-clamped cantilever 20-2 where both ends of the beam are fixed and an intermediate region of the beam is free to reciprocate in response to the collection of radioactive particles and the eventual electrical discharge as described herein. FIG. 2*c* illustrates another, non-limiting cantilever form factor 20-3 as that of a serpentine beam 101. As further shown in FIG. 2*c*, a particle collector 108 is attached to the free, distal end of the serpentine beam to provide a sufficient particle collection area. Thus regardless of the form factor of the reciprocable structure of the spring assembly, the term "cantilever" will be used herein to denote this component.

Figure 3:
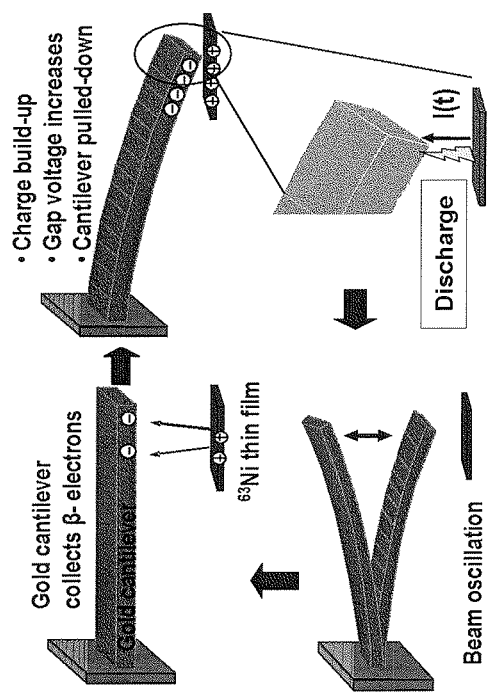
FIG. 3 is a schematic diagram illustrating the operation of the electrical discharge component, as known in the art.

The operation of a radioisotope-powered spring assembly is illustrated in FIG. 3 according to an illustrative aspect of the invention, as known from U.S. Pat. Nos. 6,479,920 and 7,301, 254, the subject matter of which is incorporated herein by reference in its entirety to the fullest extent allowed by applicable laws and rules. A gold cantilever (5 cm×0.8 cm×300 µm) was positioned a distance of approximately 500 µm above a $^{63}$Ni radioactive thin film having 1.5 mCi activity. Positive charges are accumulated on an electrically isolated $^{63}$Ni thin film due to the continuous emission of β-particles (electrons), which are collected on the gold cantilever. The accumulated charge increases with time, increasing the electrostatic force, which eventually pulls the cantilever into the radioisotope thin-film. When the gap between the cantilever and radioactive source is small enough, electrical discharge occurs through the gap. As the electrostatic force is eliminated, the beam oscillates and the process repeats itself. When the gap between the cantilever and the radioactive source is about 500 µm, for example, the pull-down cycle requires about three minutes. As the cantilever approaches the source, tunneling and direct conduction-based current result in a very short (<1 ns) discharge pulse. The energy integrated over the reciprocation period of the cantilever is also released in a very short time, generating greatly amplified power from the radioactive source.

Figure 5:
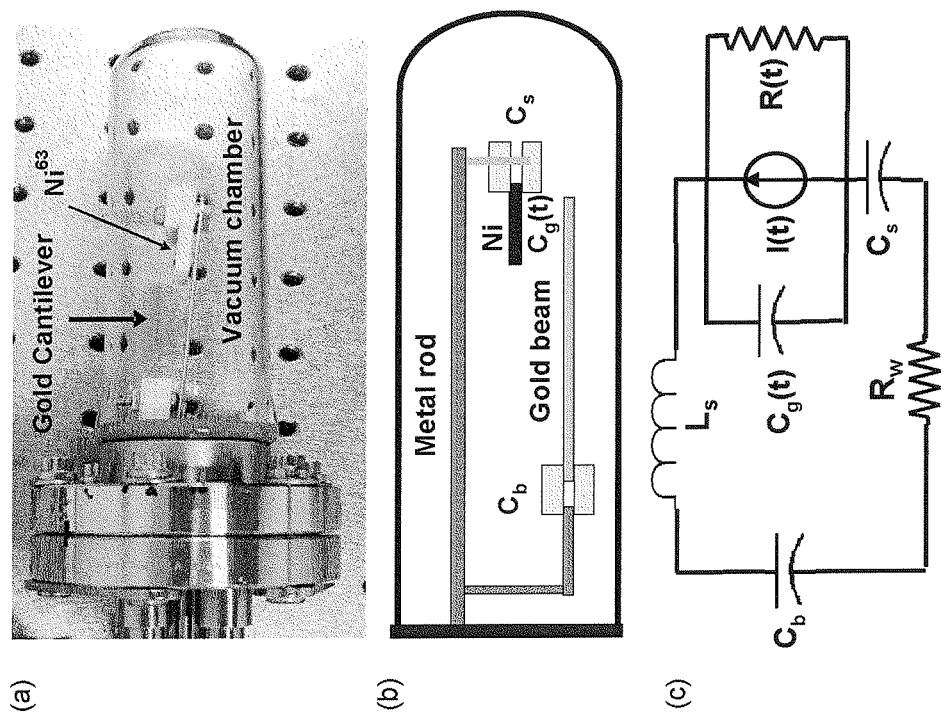
FIGS. 5(a, b, c) are a photocopy of a prototype cantilever assembly, a schematic structural diagram of the cantilever assembly, and an equivalent circuit diagram, according to a non-limiting, illustrative aspect of the invention.

The electrical discharge generates a transient magnetic and electrical field that can excite the RF modes of the cavity in which the discharge occurs. In this exemplary embodiment, the gold cantilever and the $^{63}$Ni source discharging system are housed inside a small glass vacuum chamber that is evacuated and sealed as shown in FIG. 5*a*. The chamber is connected to a vacuum pump and is pumped down to $10^{-2}$ mTorr. Both the gold cantilever and the $^{63}$Ni source are held in place with 6 mm thick Teflon plates. The structural connections and an equivalent circuit model are shown in FIGS. 5*b, c*, respectively.

Figure 6:
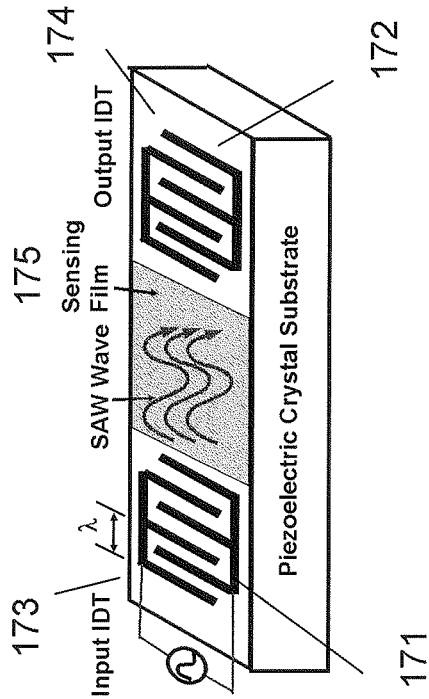
FIG. 6 is a schematic perspective diagram of an apparatus according to a non-limiting, exemplary embodiment of the invention.
Figure 7:
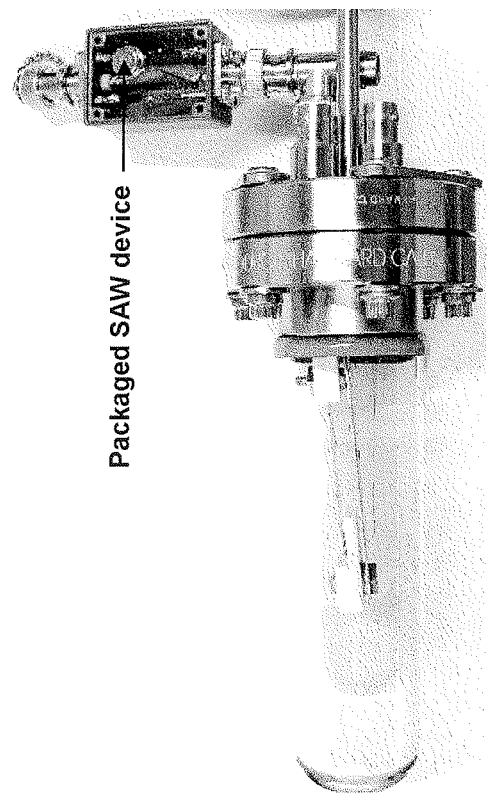
FIG. 7 is a photocopy of a prototype apparatus as illustrated in FIG. 1, with a two-port SAW resonator connected to the discharge system, according to a non-limiting, illustrative embodiment of the invention.

The generated RF modes that propagate from the cavity have a large bandwidth and the RF signal frequency is not reliably set. This can be due, e.g., to the low quality factor of the resonator cavity caused by losses such as skin-depth in the cavity metal boundary conditions and the complex part of the dielectric constants of the cavity makeup. According to an embodiment of the invention, a SAW resonator having a piezoelectric crystal substrate (hereinafter referred to as a P-SAW) can be connected to the cantilever electrical discharge assembly as illustrated mechanically in FIG. 7 and, electrically, as shown in FIG. 4. In the P-SAW resonator, the resonator frequency is determined by the gap, λ, between the fingers of an interdigitated electrode (IDT) 171 serving as the input port 173 of the P-SAW, as illustrated schematically in FIG. 6, which shows an optional sensing film 175 disposed between the input IDT 173 and an output IDT 174. In this exemplary embodiment, the P-SAW resonator has a resonator frequency of 315 MHz. When the P-SAW is excited at the input IDT 173 by the electrical discharge, the acoustic (SAW) wave travels along the surface of the piezoelectric substrate and is detected at the output IDT 174. The P-SAW device enables a two port operation. The charge emitted by the radioisotope is shared between the various capacitances of the device, which include the time-varying gap capacitance between the radioisotope source and the cantilever, the capacitance between the radioisotope source and the package electrode, and the P-SAW input port capacitance between the cantilever and the package. Additional parasitic capacitance owing to the wires and cantilever-to-package dielectric is also present. The stored charge across the P-SAW input terminals leads to a mechanical strain field under the electrodes owing to the piezoelectric substrate. When the discharge occurs, the charge on the P-SAW input electrode is discharged as the current is displaced across the input port. The stored mechanical energy and the discharge induced mechanical energy are released as mechanical surface waves, which propagate to the SAW output port. The impedance at the input port can be very high as a pure capacitance is present, while the output port can be connected to any desirable impedance, for example, 50 ohms associated with RF electronics.

Figure 8:
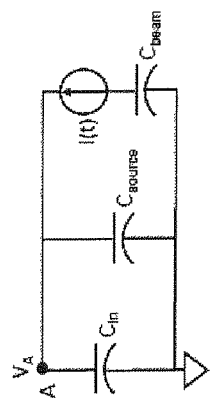
FIG. 8 is a schematic circuit diagram of a simplified circuit model of the P-SAW transponder of FIG. 1 during the charging process.

This self-powered P-SAW transponder can be modeled as an RLC circuit with a SAW resonator connected in parallel as shown in FIG. 4, with the components listed in Table 1. The circuit in the right box of FIG. 4 represents the discharge system, while the equivalent circuit of the SAW resonator is shown in the left box, where $Z_L$ represents a load impedance. During the charging cycle, the electrical energy is stored both in the discharge-system capacitors and the SAW resonator input ground-coupling capacitor, while mechanical energy is stored in the cantilever and the piezoelectric substrate of the P-SAW resonator. When an electrical discharge occurs across the gap, a sub-nanosecond high power current pulse is generated across the gap, which excites oscillations in the RLC circuit of the discharge system for hundreds of nanoseconds, while at the same time the energy stored in the SAW capacitor and substrate excites the P-SAW resonator at its resonator frequency. Both signals are measured at the output of the P-SAW device with the SAW signal having a delay equal to the time needed for the signal to travel from the input to the output IDTs at the SAW velocity. The RF signal from the discharge system reaches the P-SAW output through capacitive coupling without the SAW transit time delay. Increasing the voltage across the output port, hence the energy at the output, from the P-SAW resonator, can improve the distance over which a RF-link can be established. During the charging process, the equivalent circuit in FIG. 4 can be simplified to that shown in FIG. 8, since the SAW resonator is not excited. To increase the amplitude of the output SAW signal, the voltage at node A ($V_A$) at discharge should be maximized. The discharge voltage is only determined by the gap between the beam and the radioisotope source. The total energy stored in the SAW resonator can also be increased without changing $V_A$ by increasing the value of $C_{in}$, by increasing the number of fingers at the input IDTs. Therefore, one strategy for increasing the output signal of the transponder is to maximize the possible operable gap in the electrical discharge system, and maximize the possible number of fingers at the input IDT of the P-SAW device. This will maximize the value of $C_{in}/C_{source}$, while keeping $C_{in}+C_{source}$ constant to keep the reciprocation time constant.

P-SAW sensors can also be implemented by depositing a film(s) with various sensing properties, or other signal modulation components, between the input and output IDTs, which can modulate the signal detected at the output port (described in more detail below).

In the radioisotope-powered device embodiments described herein, radioisotope energy in the emitted electrons from the Nickel-63 (or other appropriate radioisotope) thin films is used to electrostatically charge a cantilever; the P-SAW resonator is connected such that the high impedance port of the SAW device is in parallel with the charge collection cantilever. When the stored electric energy across the cantilever is suddenly released, the P-SAW resonator is excited as the mechanical and electrical energy at the input port is released.

To test the prototype device described above, the 315 MHz SAW resonator (RPM RP1239) was connected to the gold cantilever at its input, with the output connected to a high bandwidth oscilloscope (LeCroy WaveMast 8500) with 50 ohm input impedance. The gap between the cantilever and the radioisotope source was fixed at ~500 μm, which gave a charge time of approximately three minutes.

Figure 9:
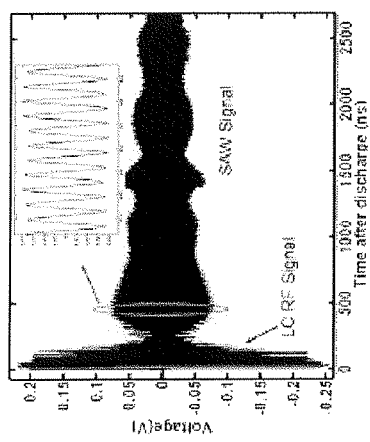
FIG. 9 is a graphical representation of a measured RF signal waveform from an exemplary apparatus including a 315 MHz P-SAW resonator.

The RF signal from the transponder recorded on the oscilloscope is shown in FIG. 9. The signal contains two parts: the RF signal generated from the LC circuit of the discharge system, which lasts about 100 ns with a maximum peak-peak voltage of about 5V, and the signal from the P-SAW resonator, which lasts ~10 μs with $0.2V_{pp}$. The total energy in the P-SAW pulse was calculated to be 2 nJ, while the total energy in the RF pulse was 5 nJ (calculated by integrating the power over the RF signal duration).

Figure 10:
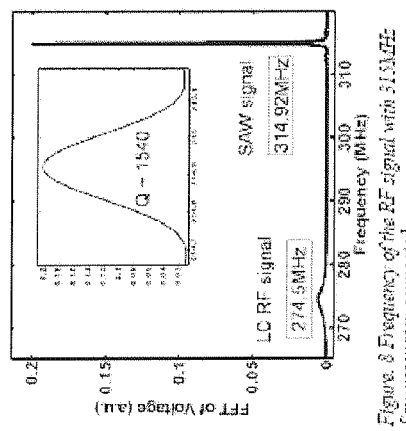
FIG. 10 shows the fast Fourier transform (FFT) of the detected signal shown in FIG. 9.
Figure 11:
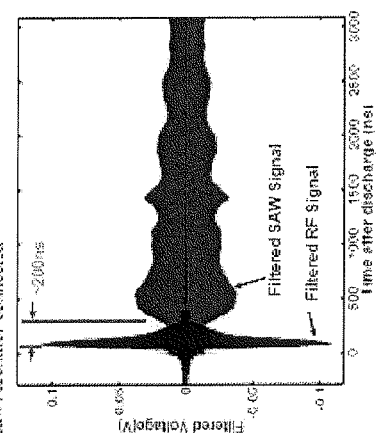
FIG. 11 is a graphical representation of the time delay between the filtered RF signal and the filtered SAW signal as shown in FIG. 9.

The FFT of the transduced signal shown in FIG. 9 is plotted in FIG. 10. The signal component from the 315 MHz P-SAW device is shown with a quality factor (Q) of 1540, while the discharge LC system has a frequency of 274 MHz and a Q of 60. The P-SAW resonator signal has a 200 ns delay, measured by comparing the signals bandpass-filtered at 315 MHz and 274 MHz, respectively (FIG. 11). The system was also tested with a 434 MHz P-SAW resonator. The 434 MHz P-SAW signal with a quality factor of 1560 and a 277 MHz (Q=70) discharge RF frequency was detected.

Figure 12:
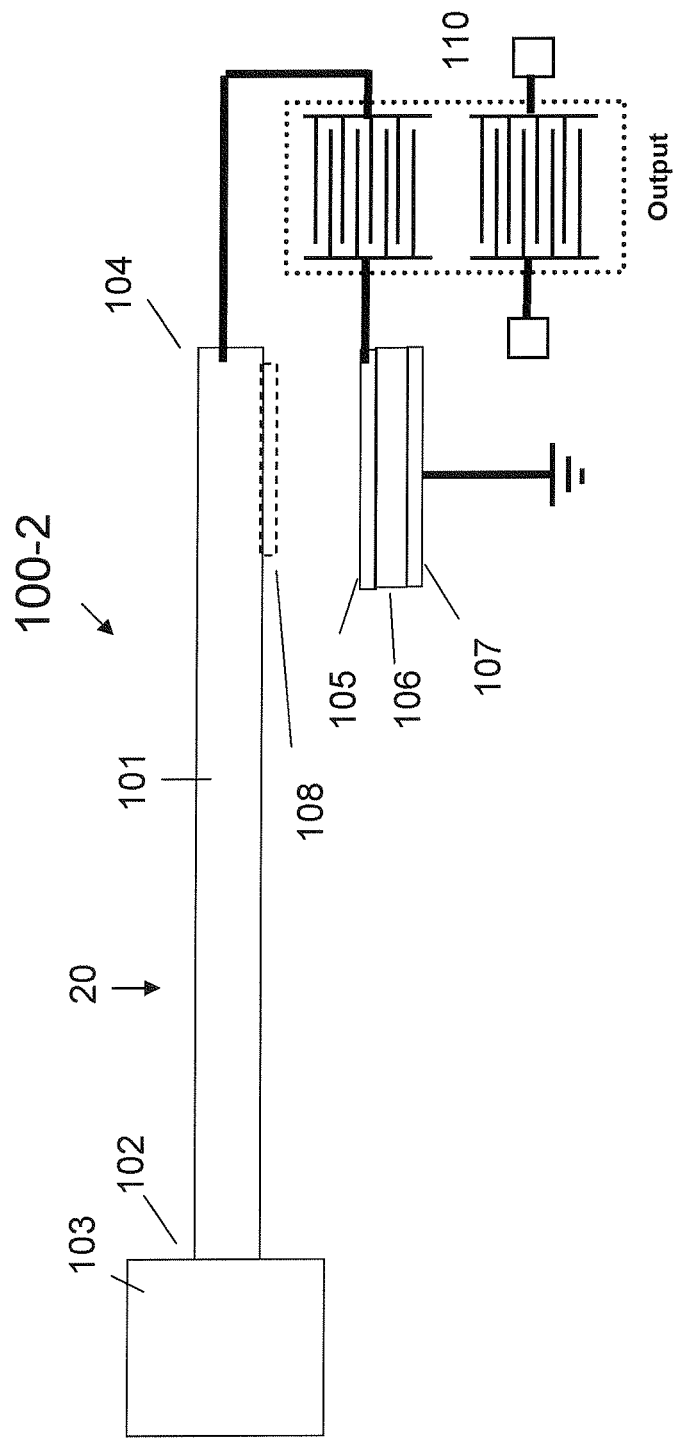
FIG. 12 is a schematic side-view diagram of an apparatus according to another non-limiting, illustrative aspect of the invention.

A self-powered, piezoelectric SAW (P-SAW) transponder 100-2 as illustrated in FIG. 12, in which the radioisotope-powered spring assembly is structurally integrated on the P-SAW component in an evacuated housing, according to another non-limiting aspect, will now be described.

The apparatus 100-2 includes components identical to that of apparatus 100-1 as illustrated in FIG. 1. A spring assembly 20 is comprised of a cantilevered beam 101 secured at a proximal end 102 thereof to a base 103. A distal end 104 of the beam is free to reciprocate up and down. The apparatus further comprises a radioisotope source 105, a dielectric insulator 106, a bottom electrode 107, and a radioactive particle (e.g., electron) collector 108 (as necessary). The relative locations of the radioisotope source and the radioactive particle collector could be reversed. A P-SAW transducer 110 also forms part of the apparatus. The P-SAW has an IDT input port 173 and at least one IDT output port 174-1. Further, an optional, integrated RF antenna 180 is shown connected to output port 174-1.

Figure 16:
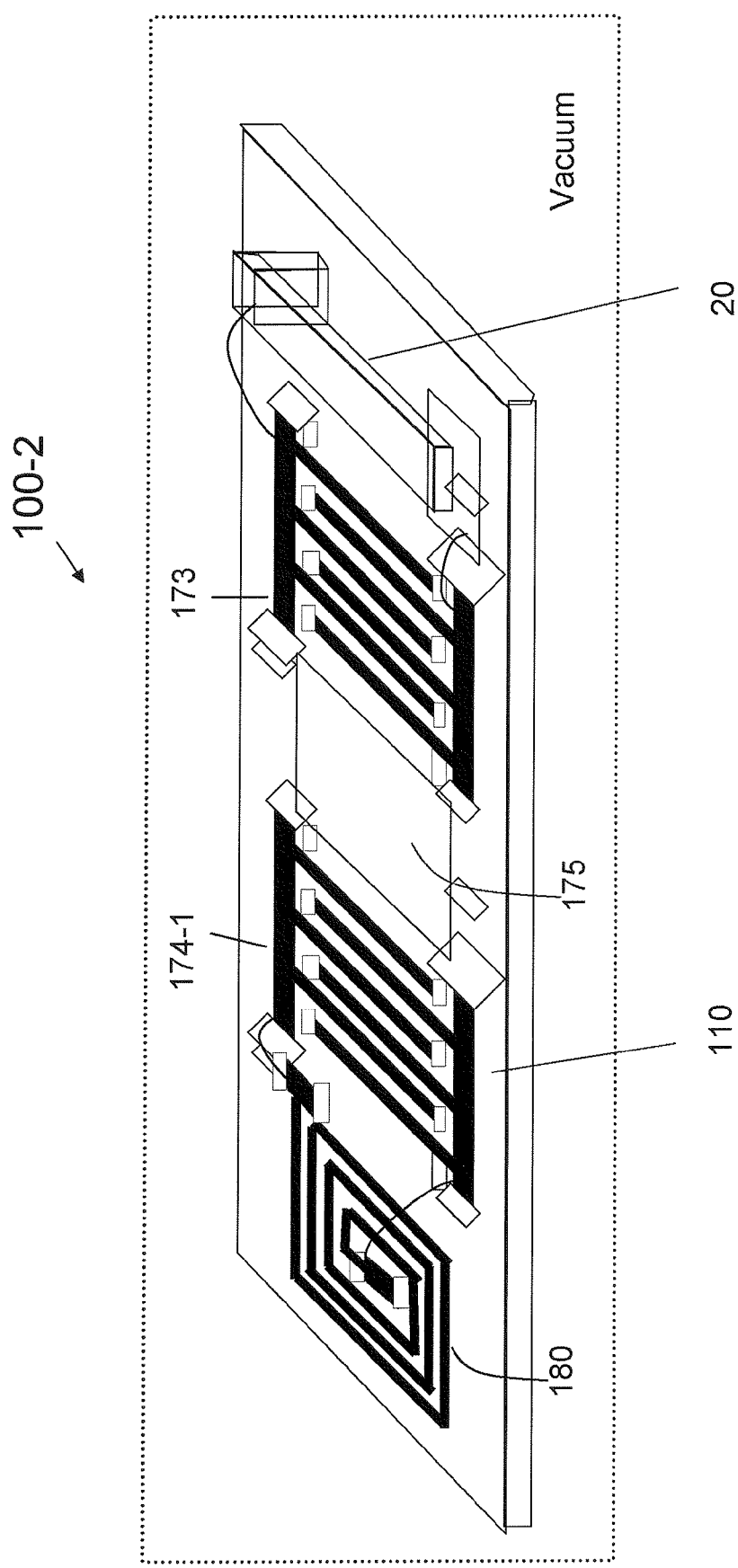
FIG. 16 is a schematic perspective diagram of an apparatus according to a non-limiting, exemplary embodiment of the invention.
Figure 17:
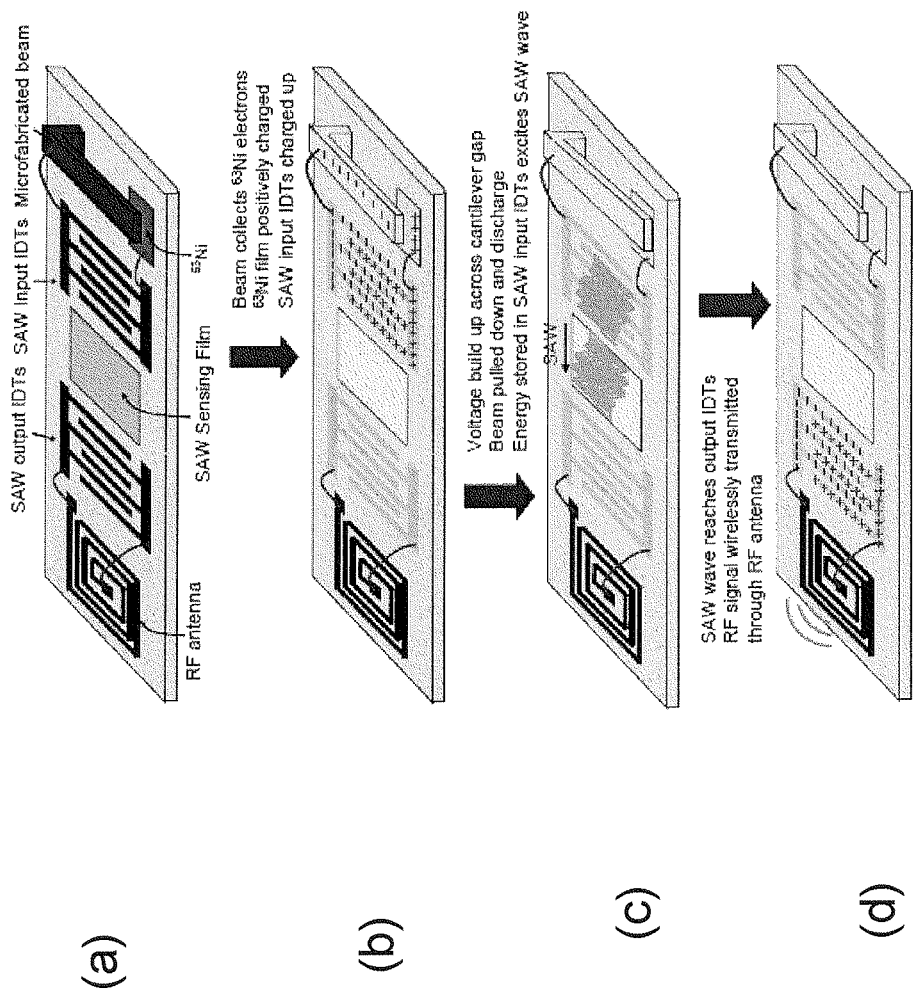
FIGS. 17(*a, b, c, d*) are schematic perspective diagrams of a microfabricated SAW resonator integrated with a microfabricated discharge system illustrating the operation of the system, according to an illustrative embodiment of the invention.

According to the instant aspect, the microfabricated spring assembly 20 is structurally integrated with the P-SAW component 110 as illustrated in FIG. 16 (which shows an optional sensing film 175 disposed between the input IDT 173 and a single output IDT 174-1). FIGS. 17(*a-d*) illustrate the operation of the apparatus 100-2. In FIG. 17b, the cantilever beam collects $^{63}$Ni electrons while the $^{63}$Ni film becomes positively charged; the P-SAW input IDTs also become charged. As voltage builds up across the cantilever gap, the beam collector and emitter sections are drawn closer until there is an electrical discharge. The energy stored in the P-SAW input IDTs excites the SAW wave, which propagates to the P-SAW output IDTs as shown in FIG. 17c. In FIG. 17d, an RF signal is wirelessly transmitted through the microfabricated RF antenna.

As before, the P-SAW resonator is connected such that the high impedance port of the P-SAW device is connected in parallel with the charge collection cantilever. The emitted charge is shared across the P-SAW port and the nonlinear capacitor, resulting in direct strain in the P-SAW device. A SAW pulse is generated as a result of strain release and induced displacement currents due to sudden charge release. The P-SAW resonator energy collected over 3-5 minutes is released in nanoseconds, which excites the SAW wave on the time scale of microseconds. This results in a collected-to-released power amplification of $10^8$.

Figure 18:
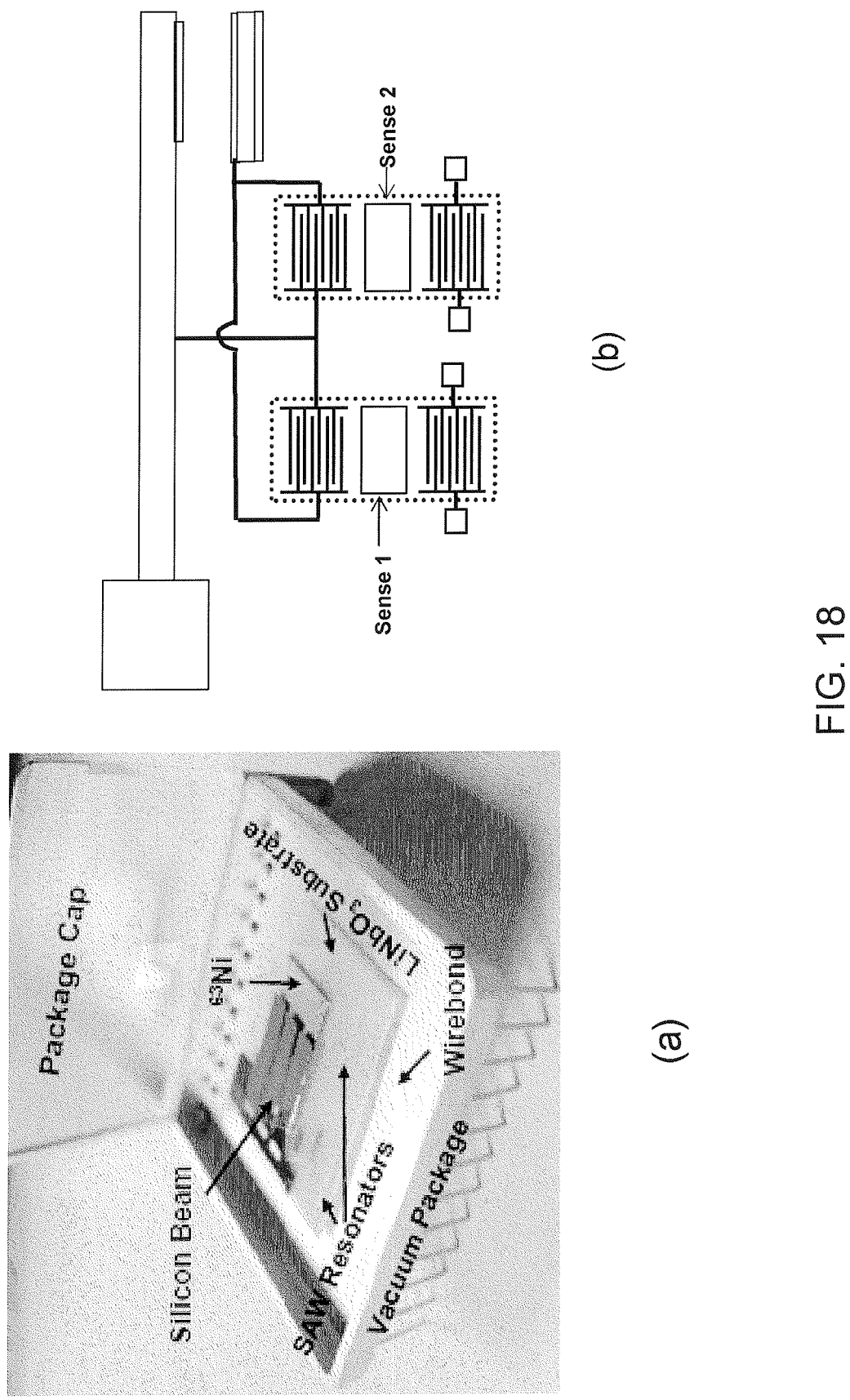
FIG. 18(*a*) is a photocopy of a prototype, multi-apparatus device according to a non-limiting, illustrative embodiment of the invention.

According to a non-limiting exemplary aspect, multiple single crystal cantilevers, 30 μm thick, with lengths of 4 mm to 8 mm, were micromachined using a two-step deep reactive ion etch (DRIE) process on a SOI wafer, and assembled alongside respective 1.5 millicurie $^{63}$Ni sources housed inside a 1 cm×1 cm×0.5 cm vacuum package, as illustrated in FIG. 18a. Respective P-SAW resonators were fabricated via an aluminum (500 nm thick) lift-off process on 128° Y-cut lithium niobate wafers. P-SAW resonator components of various frequencies were fabricated with 35 pairs of interdigitated transducers (IDTs) at both input and output ports. The equivalent circuit of the system consists of SAW equivalent inductance on the pulser side and receiver side, shown schematically in FIG. 13, with the components listed in Table 1. The circuit in the right-side dotted box represents the discharge cantilever, while the equivalent circuit of the P-SAW resonator is shown in the left-side dotted box. The vacuum package as shown in FIG. 18a was pumped down to $10^{-5}$ Torr and sealed by melting a solder layer on the edge of the package.

With a 100 MHz P-SAW resonator connected to the $^{63}$Ni discharge system, the P-SAW RF output signal was measured on a 50Ω oscilloscope load, while the RF output from the discharge system was measured wirelessly with an antenna. With a beam length of 5 mm, the RF signal from the discharge system displayed a frequency of 1.31 GHz with a (low) quality factor of ~40. A P-SAW RF signal with a maximum output power of 5 mW and a duration of 10 μs was demonstrated.

As illustrated in FIG. 18b, multiple discharging cantilevers and P-SAW structures can be deployed in a vacuum package as illustrated in FIG. 18a. In a non-limiting aspect, each of the cantilevers can be connected to different P-SAW structures. For example, multiple P-SAW structures could be coated with different sensitive films and set at different carrier frequencies by tuning the IDT finger spacing. A single trigger from one cantilever could be used to excite multiple RF pulses simultaneously and, which could be received at a single receiver, allowing multisensory information to be transmitted.

Figure 22:
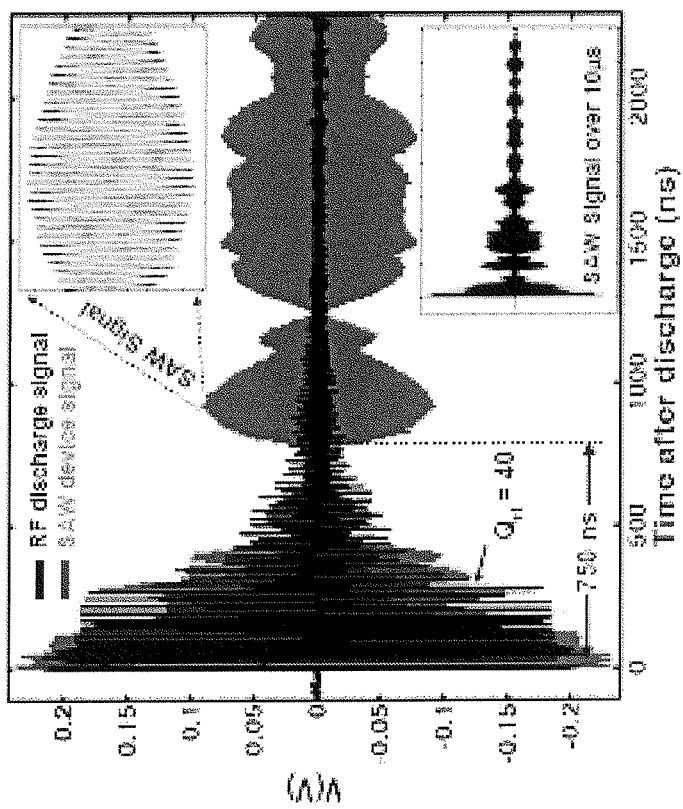
FIG. 22 is a graphical representation of an output of an exemplary device according to an illustrative aspect of the invention.

With a quality factor of over 400, the RFID signal may be detected from hundreds of feet away with the same SAW tuned receiver. The RF signal at the cantilever was also measured for the same discharge event, and a signal delay of 750 ns was detected for the P-SAW signal as shown in FIG. 22, which was due to the 3 mm gap between its input and output IDTs.

The conversion efficiency of the system η, can be defined as the energy in the detected SAW wave divided by the collected radioactive energy, expressed as $$\eta = E_{SAW}/E_{rad} = (QV^2/2Rf/T_{rec}E_eA,$$

where $E_{SAW}$ and $E_{rad}$ are the SAW output energy and radioisotope input energy, respectively; Q and V are the quality factor and voltage of the output SAW signal, respectively; R is the load resistance (50Ω); $T_{rec}$ (180 s) is the reciprocation period of the discharge system; and $E_e$ and A are, respectively, the average electron energy (17 keV) and activity of the radioactive source (1.5 mCi/cm$^2$). The prototype device reported here has a conversion efficiency of 0.06%.

To improve the conversion efficiency of the integrated RFID system, we analyzed the energy transformation process in the cantilever discharge cycle. Assuming the leakage across the vacuum gap is zero, when the radioisotope emitted-electrons cross the vacuum-gap to reach the collector, the radioisotope kinetic energy is converted to electromechanical energy and thermal energy. The thermal energy is due to electron kinetic energy dissipated in the cantilever, while the electromechanical energy is stored in the cantilever, across the air gap, across the input port of the P-SAW resonator, and across other capacitances in the system.

To reduce the percentage of radioactive energy converted into thermal energy within a discharge cycle, the average voltage across the vacuum gap can be increased by increasing the gap. Therefore, more of the radioisotope kinetic energy will be converted into electrostatic energy by overcoming the impeding electric field rather than generating heat. Since only the electromechanical energy stored across the input port of the P-SAW structure contributes to the output RF signal, as shown in FIG. 13, these capacitances can be increased while reducing other capacitances in the equivalent circuit. Impedance matching and parasitics reduction may also increase the overall conversion efficiency.

An exemplary microfabricated $^{63}$Ni radioisotope-powered RFID transponder was realized with a P-SAW structure as the transmission frequency selector. The apparatus achieved 5 mW, 10 μs long, 100 MHz carrier envelope pulses every three minutes across a 50Ω load using a 1.5 mCi $^{63}$Ni source. Because the frequency is determined by a SAW device, narrowband detection with an identical SAW device would enable the possibility for a long distance RF link.

Using MEMS microfabrication and vacuum packaging, we achieved an integrated apparatus in less than 1 cc volume. Since the half life of $^{63}$Ni is 100 years, the integrated transponder can work autonomously for decades. Such devices can be buried deep inside structural constructs such as steel and concrete, where changing batteries, and harvesting vibrational or EM energy is not reliable.

Figure 19:
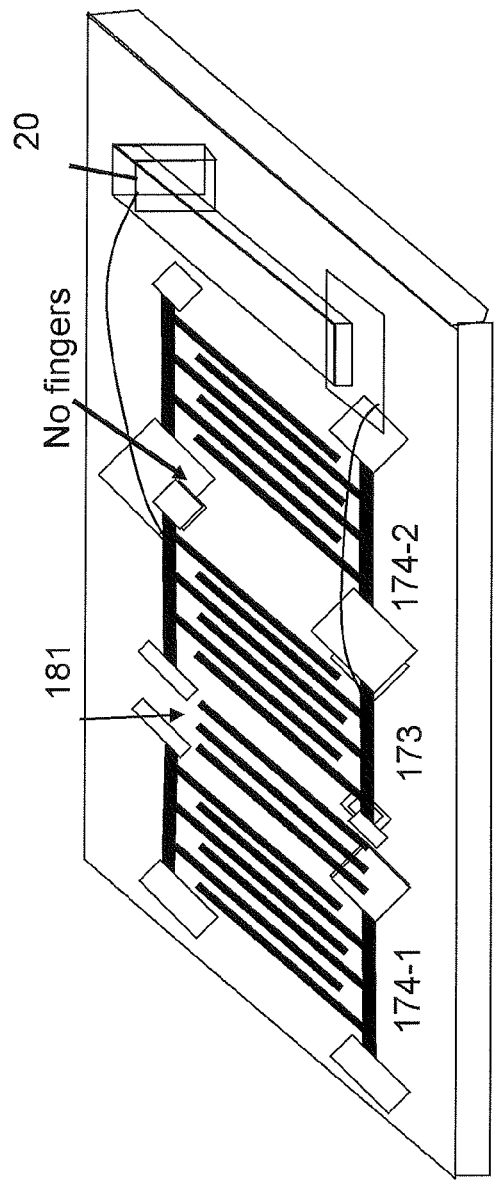
FIG. 19 is a schematic perspective diagram of an apparatus having multiple output ports according to another non-limiting, exemplary aspect of the invention.
Figure 21:
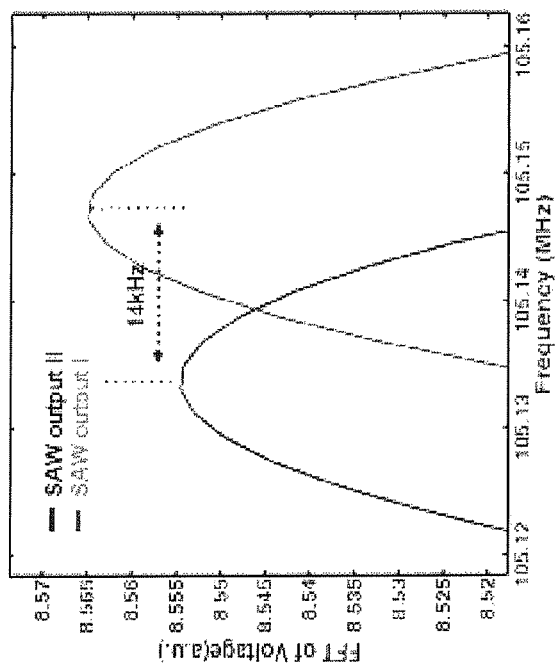
FIG. 21 is a graphical representation of an output of a device as illustrated in FIG. 19 according to an illustrative aspect of the invention.

The P-SAW transducer frequency may be further modulated by integrated or attached mass sensors or a RFID code. Sensing films or coded floating IDT fingers 181 between the excitation and receiving IDT pairs can be integrated into such a device, as illustrated in FIG. 19. For example, aluminum fingers 181 were deposited between the input port 173 and one of the output ports 174-1 to create the mass-loading effects, while the signal measured at a second output port 174-2 is used as reference. After the cantilever discharges, the P-SAW signal generated at the input port propagates towards both output ports. Due to the mass-loading effects, a frequency shift of 14 kHz at 100 MHz center frequency was produced at the output with the loading fingers, as shown in FIG. 21, generating beat notes at the output.

Figure 20:
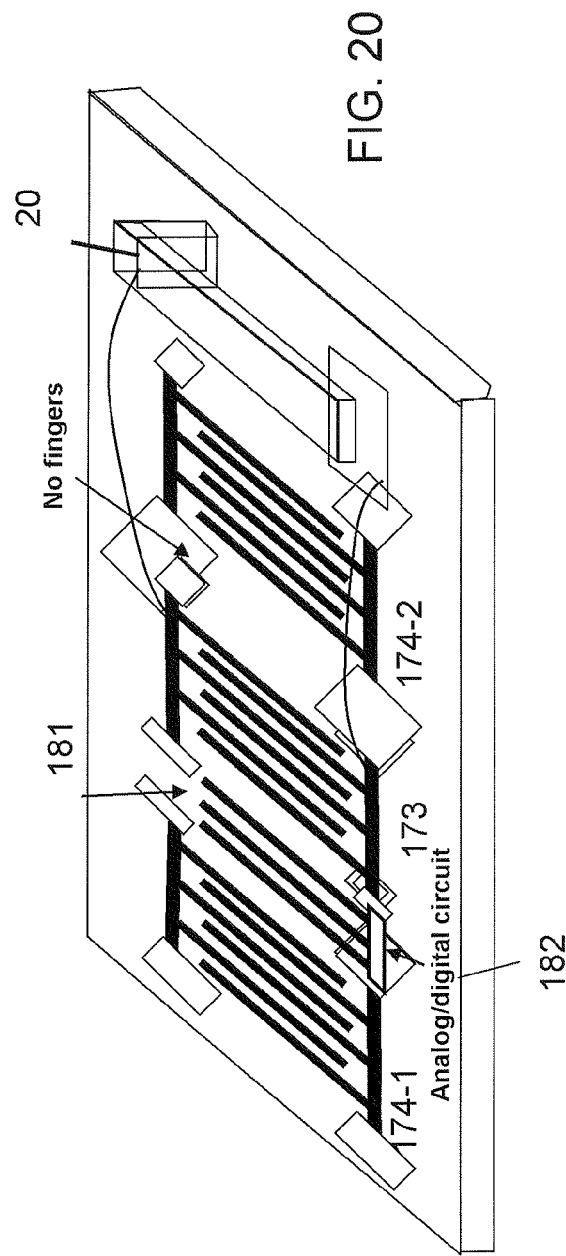
FIG. 20 schematically shows an apparatus in which a center electrode is connected to an external circuit, according to non-limiting, exemplary aspect of the invention.

In addition to realizing a RFID by using IDT fingers that are floating or grounded, each of the center electrode area could be driven by voltages provided by an analog or digital circuit 182 such that the finger voltage values are indicative of information to be transmitted. The analog voltages will affect the reflected and transmitted pulses to modify the transmitted pulses. Such an embodiment is schematically illustrated in FIG. 20.

P-SAW sensors may be fabricated and integrated into the apparatus to realize a complete miniature self-powered wireless sensor node.

Figure 14:
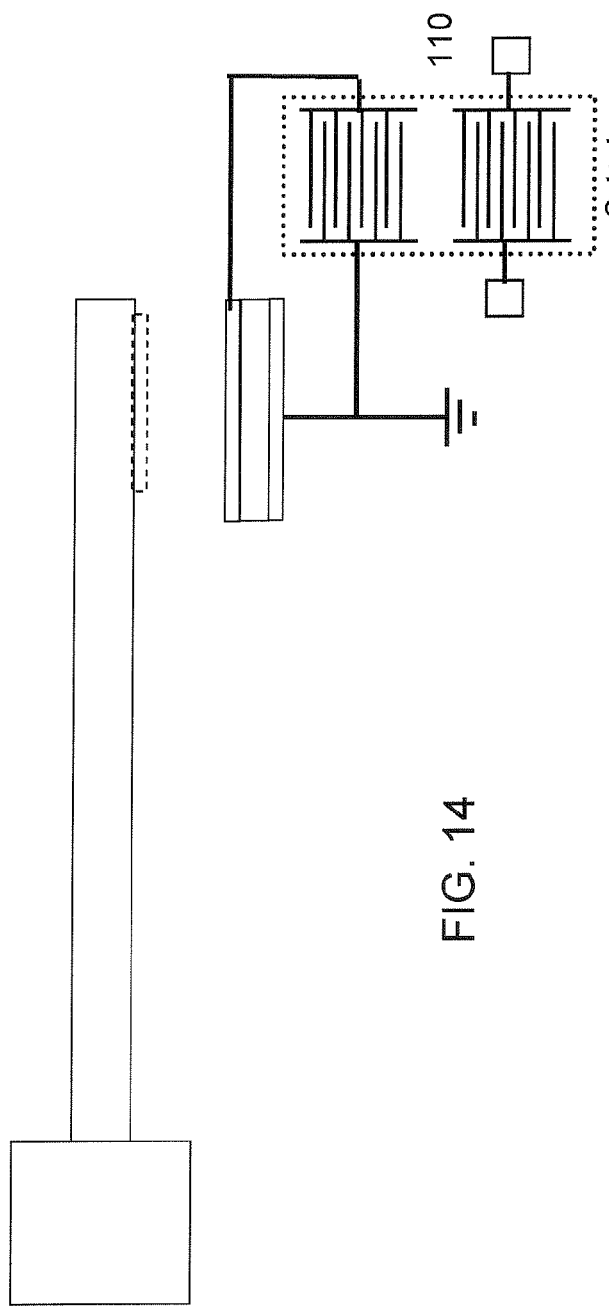
FIG. 14 is a schematic side-view diagram of an apparatus according to another non-limiting, illustrative aspect of the invention.
Figure 15:
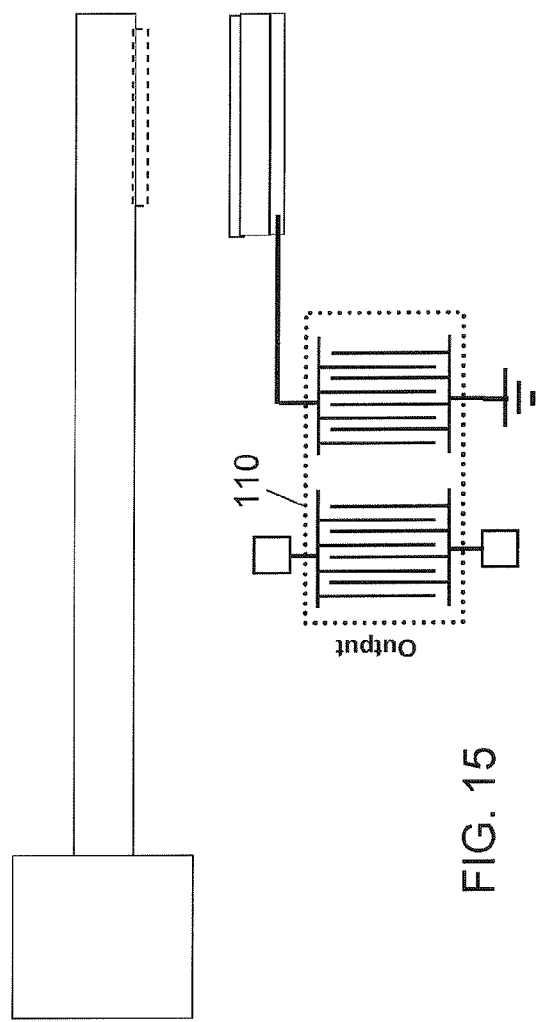
FIG. 15 is a schematic side-view diagram of an apparatus according to another non-limiting, illustrative aspect of the invention.

FIGS. 14 and 15 show alternative apparatus configurations to those illustrated in FIGS. 1 and 12.

TABLE I

| Component | Representation | Value |
| --- | --- | --- |
| $C_{beam.}$ | Beam ground capacitance | 8.3 pF |
| $C_{source.}$ | Source ground capacitance | 8.3 pF |
| I(t) | Air gap current | — |
| L | Discharge system inductance | 72 μH |
| $C_{in.}$ | Input SAW IDT capacitance | 2.2 pF |
| $C_{0.}$ | output SAW IDT capacitance | 2.2 pF |
| $L_{saw.}$ | SAW equivalent inductance | 758 μH |

TABLE I-continued

| Component | Representation | Value |
| --- | --- | --- |
| $C_{saw}$ | SAW equivalent capacitance | 0.337 fF |
| $R_{saw}$ | SAW equivalent resistance | 84 Ω |

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. No language in the specification should be construed as indicating any non-claimed element as essential to the practice of the invention.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed is:

1. A self-powered device, comprising:
    a radioisotope-powered current impulse generator including a spring assembly comprising a cantilever having at least one fixed end attached to a base and a reciprocal region, further including a radioactive particle emitter;
    a piezoelectric-surface acoustic wave (P-SAW) structure including an input port electrically connected in parallel to the current impulse generator and an output port;
    a radioactive particle receiver that is attached to one of the reciprocal region of the cantilever and the spring assembly at an opposing distance above or below the reciprocal region of the cantilever,
    characterized by an operable distance between the radioactive particle emitter and the radioactive particle receiver that is a maximum distance and the interdigitated electrodes of the input port have a maximum number of electrode fingers, wherein each of the input port and the output port include a plurality of interdigitated electrodes.

2. The device of claim 1, wherein the cantilever is a simple cantilever beam having a fixed, proximal end and a freely reciprocal, distal end.

3. The device of claim 1, wherein the cantilever is a clamped-clamped cantilever having two fixed ends and an intermediate reciprocal region.

4. The device of claim 1, wherein the cantilever is a serpentine beam having a fixed, proximal end and a freely reciprocal, distal end.

5. The device of claim 1, wherein the P-SAW import port is electrically coupled to the spring assembly proximate the at least one fixed end of the cantilever.

6. The device of claim 1, wherein the P-SAW import port is electrically coupled to the spring assembly proximate the reciprocal region of the cantilever.

7. The device of claim 1, wherein the spring assembly is structurally integrated with the P-SAW transducer in a vacuum environment.

8. The device of claim 1, wherein the spring assembly is disposed in a vacuum environment and the P-SAW transducer is disposed in a non-vacuum environment.

9. The device of claim 1, further comprising an RF antenna coupled to the P-SAW output port.

10. The device of claim 1, wherein the interdigitated electrodes of the input port have a selected gap-spacing that determines a selected resonant frequency of the P-SAW transducer.

11. The device of claim 1, comprising a plurality of spring assemblies and interconnected P-SAW structures having different resonant frequencies.

12. The device of claim 1, wherein the P-SAW structure includes a signal modulation component disposed intermediate the import port and the output port.

13. The device of claim 12, wherein the signal modulation component comprises at least one of a mass sensor and an RFID code comprising interdigitated transducer (IDT) fingers.

14. The device of claim 13, wherein the IDT is connected to at least one of an external analog and a digital circuit.

15. The device of claim 1, wherein the distance between the radioactive particle emitter and the radioactive particle receiver is a maximum operable distance to maximize energy output.

16. The device of claim 1, characterized by a Nickel-63 radioisotope powered P-SAW structure.

17. A method for generating an RF signal having a tuned signal frequency, comprising:
    generating energy through an energy pulse from an autonomous electrical discharge system having a charging cycle and a discharge cycle;
    inputting the energy to an input port of a piezoelectric-SAW (P-SAW) structure characterized by a resonant frequency, wherein, during the charging cycle, storing an electrical component of the energy and a mechanical component of the energy in the P-SAW structure;
    during the discharge cycle, exciting the resonant frequency of the P-SAW structure; and
    outputting an RF signal having a frequency tuned to the P-SAW resonant frequency from an output port of the P-SAW structure.

18. The method of claim 17, wherein the step of generating energy through an energy pulse from an autonomous electrical discharge system comprises collecting emitted electrons from a radioactive source to generate the electrical discharge.

19. The method of claim 17, wherein the discharge cycle has a duration equal to or less than one nanosecond.

20. The method of claim 17, wherein the charging cycle has a duration between about three to five minutes.

21. The method of claim 17, wherein the step of outputting the RF signal comprises generating a relatively shorter duration, higher voltage component and a relatively longer duration, lower voltage component of the signal.

22. The method of claim 21, comprising time delaying the relatively longer duration, lower voltage component with respect to the relatively shorter duration, higher voltage component.

23. The method of claim 17, wherein the input port of the P-SAW structure is comprised of an interdigitated transducer electrode.

24. The method of claim 17, wherein the step of outputting the RF signal further comprises modulating the RF signal via a signal modulation component disposed intermediate the input port and at least one output port of the P-SAW structure.

* * * * *